United States Patent [19]

Okumura

[11] Patent Number: 4,912,535

[45] Date of Patent: Mar. 27, 1990

[54] TRENCH TYPE SEMICONDUCTOR MEMORY DEVICE HAVING SIDE WALL CONTACT

[75] Inventor: Yoshinori Okumura, Hyogo, Japan

[73] Assignee: Mitsubishi Denki Kabushiki Kaisha, Tokyo, Japan

[21] Appl. No.: 232,641

[22] Filed: Aug. 8, 1988

[30] Foreign Application Priority Data

Aug. 8, 1987 [JP] Japan .............................. 62-198566
Dec. 2, 1987 [JP] Japan .............................. 62-306122

[51] Int. Cl.⁴ ..................... H01L 29/78; H01L 29/06; H01L 27/02
[52] U.S. Cl. .................................... 357/23.6; 357/55; 357/41
[58] Field of Search ........................... 357/23.6, 55, 41

[56] References Cited

U.S. PATENT DOCUMENTS

| Re. 32,090 | 3/1986 | Jaccodine et al. | 357/55 |
|---|---|---|---|
| 4,503,451 | 3/1985 | Lund et al. | 357/55 |
| 4,801,988 | 1/1989 | Kenney | 357/23.6 |
| 4,801,989 | 1/1989 | Taguchi | 357/23.6 |
| 4,820,652 | 4/1989 | Hayashi | 357/23.6 |

OTHER PUBLICATIONS

M. Taguchi et al., "Dielectrically Encapsulated Trench Capacitor Cell", *IEDM* 86 (1986): 136-139.
K. Fujishima et al., "A 256K Dynamic RAM with Page-Nibble Mode" *IEEE Journal of Solid-State Circuits*, vol. SC-18, No. 5, (Oct., 1983): 470-478.
F. Baba et al., "A 64K DRAM with 35 ns Static Column Operation", *IEEE Journal of Solid-State Circuits*, vol. SC-18, No. 5, (Oct. 1983): 447-451.
S. Nakajima et al., "An Isolation-Merged Vertical Capacitor Cell for Large Capacity DRAM", *IEDM* 84, (1984): 240-243.

*Primary Examiner*—Rolf Hille
*Assistant Examiner*—Robert P. Limanek
*Attorney, Agent, or Firm*—Lowe, Price, LeBlanc, Becker & Shur

[57] ABSTRACT

A semiconductor substrate is formed on its major surface with a first trench and a second trench which is deeper than the first trench. A region held between the first and second trenches serves as a transistor, and impurity regions for serving as source/drain regions are formed on the first and second trench sides. A bit line fills up the first trench and a capacitor electrode fills up the second trench, to be in contact with the impurity regions respectively. A word line is formed on a channel region between the source and drain regions through an oxide film. A semiconductor layer is formed on the major surface of a semiconductor substrate through an oxide film, to be provided with a first trench having the oxide film as a bottom surface and a second trench reaching the semiconductor substrate. The semiconductor layer held between the first and second trenches serves as a transistor, while a bit line and a capacitor electrode fill up the first and second trenches respectively. Two trenches are formed on the major surface of a semiconductor substrate to be provided with a semiconductor device, so that the trenches are filled up with interconnection members. The trenches are respectively provided on their side walls with impurity regions, which are connected with each other by an impurity region formed on the major surface of the semiconductor substrate.

33 Claims, 19 Drawing Sheets

TRENCH TYPE SEMICONDUCTOR MEMORY DEVICE HAVING SIDE WALL CONTACT

BACKGROUND OF THE INVENTION

1. Field of the Invention

The present invention relates to semiconductor integrated circuits, and more particularly, it relates to a forming electrical contact regions between different elements of the integrated circuits without forming surface protection thereon.

2. Description of the Prior Art

FIG. 1 is a block diagram showing an exemplary structure of a general RAM. The structure of such a RAM is disclosed in literature such as IEEE JOURNAL OF SOLID-STATE CIRCUITS, VOL. SC-18, NO. 5, Oct. 1983. Referring to FIG. 1, a memory cell array 101 is formed by a plurality of word lines and a plurality of bit lines which intersect with each other to be provided with memory cells in respective intersections. A memory cell is selected on the basis of an intersection between a word line selected by an X-address buffer decoder 102 and a bit line selected by a Y-address buffer decoder 103. Indication for writing/reading data in/from the selected memory cell is made by a read-/write control signal R/W which is supplied to an R/W control circuit 104. In data writing, input data $D_{in}$ is inputted in the selected memory cell through the R/W control circuit 104. In data reading, on the other hand, data stored in the selected memory cell is detected by a sense amplifier 105 and thereafter amplified, to be outputted to the exterior through a data output buffer 106 as output data $D_{out}$.

FIG. 2 shows an equivalent circuit diagram of a dynamic type memory cell, for illustrating write/read operation for the memory cell.

Referring to FIG. 2, the dynamic memory cell is formed by a field-effect transistor 108 and a capacitor 109. The gate electrode of the field-effect transistor 108 is connected to a word line 110 and a source/drain electrode, which is connected with the capacitor 109, is connected to a bit line 107 respectively. In data writing, the field-effect transistor 108 conducts by application of a prescribed potential to the word line 110, whereby charges applied to the bit line 107 are stored in the capacitor 109. In data reading, on the other hand, the field-effect transistor 108 conducts by application of a prescribed potential to the word line 110, whereby the charges stored in the capacitor 109 are drawn out through the bit line 107.

FIG. 3 illustrates plane layout of a memory part of a dynamic MOSRAM (random access memory) being in folded bitline structure, and FIG. 4 is a sectional view taken along the line. IV—IV in FIG. 3.

The structure of the dynamic MOSRAM is now described with reference to these figures.

The RAM is provided with pairs of MOS transistors and capacitors formed in active regions 112, which are isolated from adjacent elements by isolation oxide films 20 in bottom portions of trenches 18 formed on prescribed positions of the major surface of a semiconductor substrate 3. Each MOS transistor is formed by impurity regions 42 and 44 provided on the major surface of the semiconductor substrate 3 to serve as source or drain regions and a word line 9 for serving as a gate electrode provided through an oxide film 24 on a region between the impurity regions 42 and 44. Each capacitor is formed by an impurity layer 46a connected to the impurity region 44, an impurity layer 46b provided on the side wall of the trench 18 and a cell plate 6 provided on the impurity layers 46a and 46b to also cover the isolation oxide film 20 on the bottom portion of the trench 18 through a capacitor dielectric film 7. An interlayer isolation film 48 is formed by an oxide film to cover the transistor and the capacitor, and a bit line 1 provided on the interlayer isolation film 48 is connected to the impurity region 42 through a contact 12 in a contact hole 49 which is provided in the interlayer isolation film 48.

Such a semiconductor memory device having trench type capacitors is disclosed in "An Isolation-Merged Vertical Capacitor Cell for Large Capacity DRAM", IEDM 1984.

In the RAM of such structure, a prescribed potential is applied to a selected word line 9 to allow conduction of the region between the impurity regions 42 and 44 under the same, thereby to perform read/write operation.

FIGS. 5A to 5H are sectional views schematically showing steps of a method of manufacturing the conventional device.

With reference to these figures, description is now made on such a manufacturing method.

First, an ion which is reverse in conductivity type to a semiconductor substrate 3 is injected into the major surface of the semiconductor substrate 3 and subjected to heat treatment, thereby to form an impurity layer 46a diffused with the ion, being reverse in conductivity type to the semiconductor substrate 3, in a prescribed region (FIG. 5A).

Then an oxide film 50 is formed over the entire major surface of the semiconductor substrate 3, and a trench 18 of prescribed depth is formed on the semiconductor substrate 3, including the oxide film 50 covering a part of the impurity layer 46a. Then a nitride film 52 is deposited over the entire surface including the inner surface of the trench 18, and thereafter the nitride film 52 is partially removed from the bottom surface part of the trench 18 (FIG. 5B).

An ion which is identical in conductivity type to the semiconductor substrate 3 is injected into the bottom surface part of the trench 18, which in turn is thermally oxidized to form an impurity layer 22 diffused with the ion, being identical in conductivity type to the semiconductor substrate 3, and a thick isolation oxide film 20 (FIG. 5C).

The nitride film 52 is removed and an ion which is reverse in conductivity type to the semiconductor substrate 3 is injected into the side wall part of the trench 18 by oblique ion implantation or the like and subjected to heat treatment, thereby to form an impurity layer 46b diffused with the ion being reverse in conductivity type to the semiconductor substrate 3 (FIG. 5D).

The oxide film 50 is removed and a capacitor insulation film 7 is formed over the bottom surface part and the side wall part of the trench 18 and a part of the major surface of the semiconductor substrate 3 through CVD, thermal oxidation or the like. An electrode material such as polysilicon, being mixed with an impurity, is deposited over the entire surface including the inner surface of the trench 18 and an oxide film is further deposited over the entire surface including the inner surface of the trench 18 and subjected to an etchback process through anisotropic etching, thereby to embed an oxide film 54 on the polysilicon material in the trench 18 and flatten the same. At this time, the flattened part is made to expose the polysilicon material. Then a photoengraving process and etching are performed to form a cell plate 6, having a flat surface part of a prescribed configuration, from the polysilicon material (FIG. 5E).

An oxide film 24 for serving as a transfer gate insulation film is formed by thermal oxidation or the like, and films of polysilicon and metal silicide having a high melting point are sequentially laminated on the entire surface to be subjected to a photoengraving process and etching, thereby to form a word line 9. An arsenic (As) ion which is reverse in conductivity type to the semiconductor substrate 3 is injected into exposed major surface parts of the semiconductor substrate 3 and subjected to heat treatment, thereby to form impurity regions 42 and 44 diffused with the ion being reverse in conductivity type to the semiconductor substrate 3 (FIG. 5F).

An oxide film is provided over the entire major surface of the semiconductor substrate 3 including the word line 9 by CVD, to form an interlayer isolation film 48. A resist film 50 is applied onto the entire surface of the interlayer isolation film 48, and an exposure mask 54 is set above the same. The exposure mask 54 is provided with an opening 56, which corresponds to a contact hole to be defined in the interlayer isolation film 48. The exposure mask 54 is exposed to sensitize only a portion of the resist film 50 corresponding to the opening 56, to define an opening 52 for forming the contact hole (FIG. 5G).

The resist film 50 is used as a mask to etch the interlayer isolation film 48 exposed through the opening 52 to reach the major surface of the semiconductor substrate 3, thereby to define a contact hole 49. Phosphorus (P) is injected into the major surface of the semiconductor substrate 3 through the contact hole 49 and diffused by heat treatment, thereby to form an N-type impurity region 58 of high concentration. This impurity region 58 is adapted to prevent punch-through of an aluminum wire, which is formed in a contact hole 12 in a later step, to the semiconductor substrate 3. Finally a film of aluminum, metal silicide having a high melting point or a metal having a high melting point is deposited over the entire surface including the inner surface of the contact hole 49, and patterned to form a bit line 1 which is connected with the impurity region 42 through a contact 12 (FIG. 5H).

In the conventional semiconductor memory device of the above structure, an attempt has been made to improve the degree of integration of the capacitor part by employing a trench type configuration, whereas factors preventing improvement in density and degree of integration have remained in other parts. Namely, the word line 9 must be separated by a prescribed distance from the contact 12 for the following reasons:

(1) When the aluminum wire for serving as the bit line 1 is connected to only the impurity region 42, formed by implantation of As, for serving as a source or drain region of the transistor formed on the major surface of the semiconductor substrate 3 through the contact 12, silicon under the impurity region 42, which is small in depth, is absorbed into the aluminum wire to damage the boundary portion. In order to prevent current leakage from the bit line 1 to the semiconductor substrate 3 caused by such damage, the impurity region 58 is formed by implantation of phosphorus, which is generally larger in diffusivity than As. However, the impurity region 58 is largely spread from the major surface of the semiconductor substrate 3 by heat treatment, not only toward the substrate but also toward the word line 9. Spreading of the impurity region 58 to the channel region under the word line 9 exerts bad influence on the performance characteristic of the transistor. Therefore, the impurity region 58 is not spread toward a transfer gate region under the word line 9 by diffusion of the injected ion through heat treatment.

(2) As shown in FIG. 5G, the opening 52 is formed in the resist film 50 through the photoengraving process in order to define the contact hole in the interlayer isolation film 48. However, since the exposure mask 54 is mechanically set for determining the position of the opening 52, misregistration (size L) of the exposure mask 54 based on mechanical accuracy cannot avoided. In other words, the contact hole must be located in consideration of overlay accuracy of the exposure mask 54.

In a DRAM of 4M, for example, allowance of about 0.6 μm for diffusivity in paragraph (1), allowance of about 0.2 μm (size L) for accuracy in mask alignment of paragraph (2) and actual allowance of 0.1 μm, i.e., a distance of about 0.9 μm in total is required between an end portion of the word line 9 and the side wall of the contact hole 49. Allowance of 0.8 μm, in total, concerning paragraphs (1) and (2) has been a significant problem against improvement in degree of integration, in consideration of the fact that the width of the word line 9 is about 0.8 to 1.0 μm.

Even if the said distance can be reduced in the conventional device, at least the occupied area for the contact part, which is basically provided on a flat part of the major surface of the semiconductor substrate, must be ensured. Thus, there has been a limit for improvement in degree and density of integration of the device.

SUMMARY OF THE INVENTION

An object of the present invention is to provide interconnection between components of the integrated circuit without forming surface projection therefrom.

Another object of the present invention is to provide a semiconductor memory device which improves integration density.

Still another object of the present invention is to improve interconnection between bit lines and transistors of semiconductor memory devices.

Yet another object of the present invention is to provide increased separation between word lines and bit lines contact region of a semiconductor memory cell.

Yet still another object of the present invention is to provide interconnection between a bit line and a transistor of a semiconductor memory cell with no contact hole.

A further object of the present invention is to provide a semiconductor memory device which is improved in positional relation between a bit line and a word line.

A further object of the present invention is to provide a semiconductor memory device which relaxes a step configuration of an interlayer isolation film formed between a bit line and a word line.

A further object of the present invention is to provide a semiconductor memory device, the bit line of which is hard to disconnect.

A further object of the present invention is to provide interconnection between a conductor and a transistor of a semiconductor device with no contact hole.

Provided according to the present invention is a semiconductor memory device including a transistor and a capacitor connected to the transistor, which semiconductor memory device comprises a semiconductor substrate having a major surface and a trench formed on the major surface, an impurity region formed on a side wall of the trench to be connected to the transistor and a conductor formed in the first trench to be in contact with the impurity region.

Provided according to another aspect of the present invention is a semiconductor memory device including a transistor and a capacitor connected to the transistor, which semiconductor memory device comprises a semiconductor substrate having a major surface, an insulation film formed on the major surface of the semiconductor substrate, a semiconductor layer formed on the insulation film and having a major surface and a trench formed on the major surface to reach the insulation film, an impurity region formed on a side wall of the trench to be connected to the transistor and a conductor formed in the trench to be in contact with the impurity region.

Provided according to still another aspect of the present invention is a semiconductor memory device which comprises a semiconductor substrate having a major surface and a trench formed on the major surface, an impurity region formed on a part of the major surface of the semiconductor substrate including a side wall of the trench and a conductor formed in the trench to be in contact with the impurity region.

Provided according to still another aspect of the present invention is a semiconductor device which comprises a semiconductor substrate having a major surface and a trench formed on the major surface, an impurity region formed on a part of the major surface of the semiconductor substrate including a side wall of the trench and a conductor formed in the trench to be in contact with the impurity region.

According to the present invention, the trench is formed on the major surface of the semiconductor substrate so that the impurity region being connected to the transistor is in contact, on the side wall of the trench, with the conductor being formed in the trench, whereby no contact hole is required.

According to another aspect of the present invention, the semiconductor layer is formed on the major surface of the semiconductor substrate through the insulation film so that the impurity region connected to the transistor is in contact, on the side wall of the trench formed on the semiconductor layer to reach the insulation film, with the conductor being formed in the trench, whereby no contact hole is required.

According to still another aspect of the present invention, the trench is formed on the major surface of the semiconductor substrate so that the impurity region formed on the semiconductor substrate is in contact, on the side wall of the trench, with the conductor being formed in the trench, whereby the conductor is in conduction with the impurity region under the major surface of the semiconductor substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
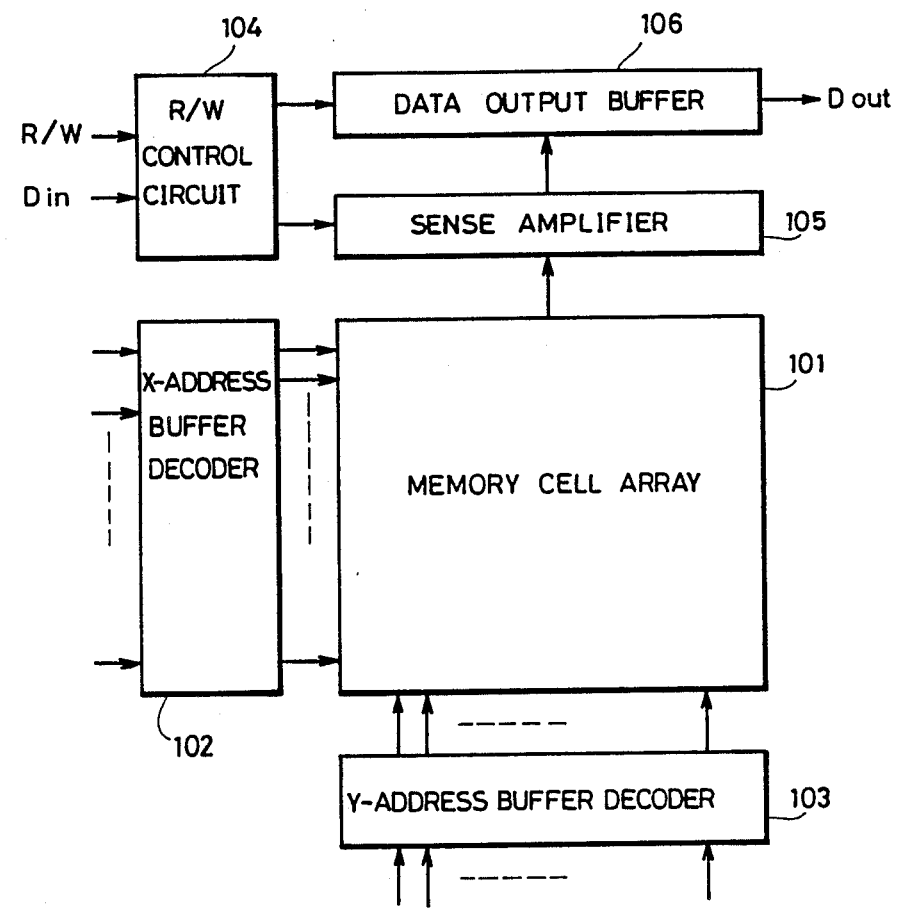
FIG. 1 is a block diagram showing exemplary structure of a general RAM.
Figure 2:
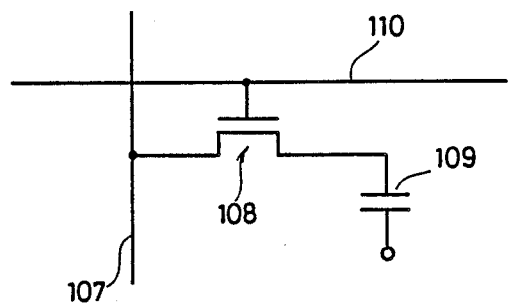
FIG. 2 is an equivalent circuit diagram of a dynamic memory cell for illustrating read/write operation for a memory cell.
Figure 3:
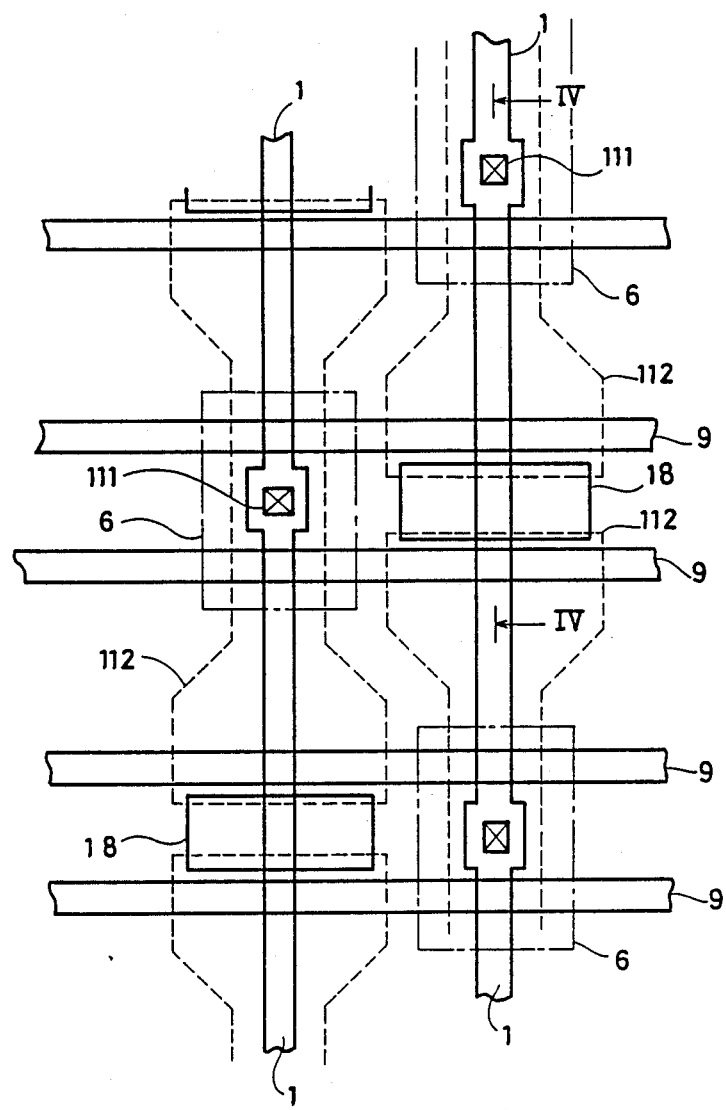
FIG. 3 illustrates plane layout of a memory part of a dynamic MOSRAM in folded bitline structure.
Figure 4:
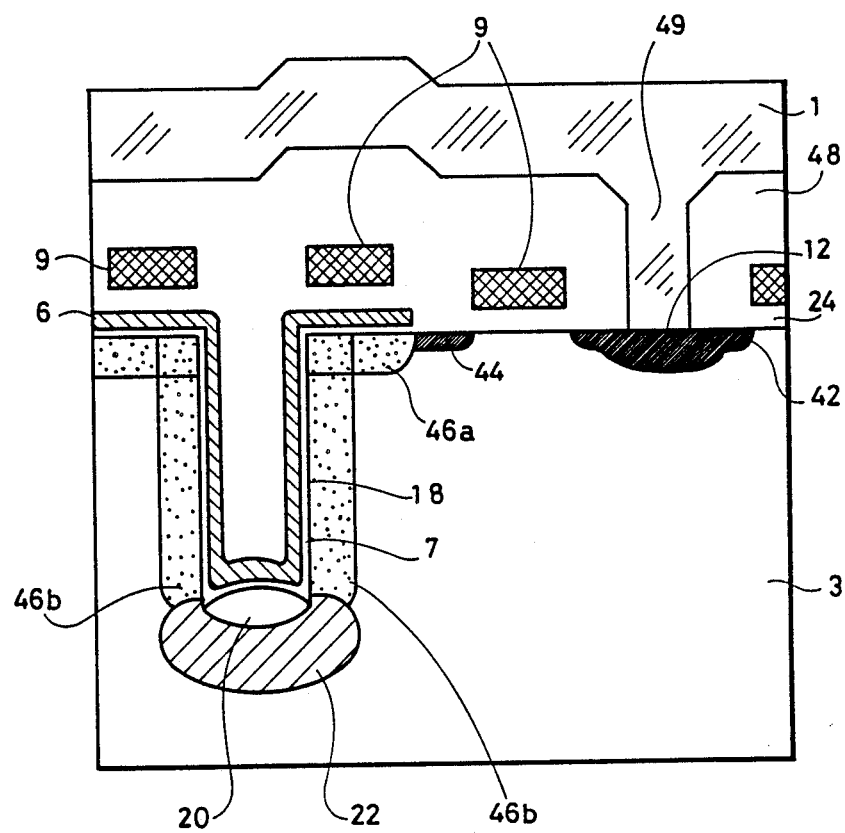
FIG. 4 is a sectional view taken along the line IV—IV in FIG. 3.
Figure 5A:
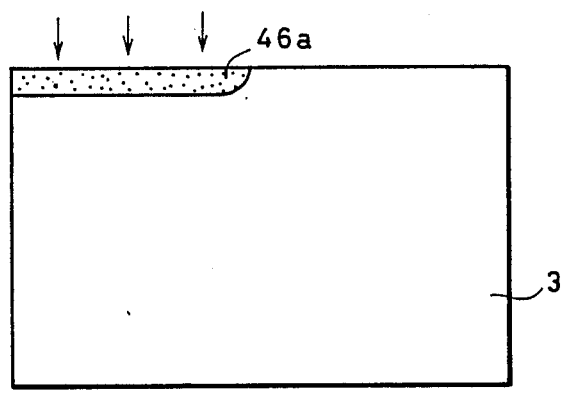
FIGS. 5A to 5H are sectional views schematically showing steps of a method of manufacturing the conventional device.
Figure 5B:
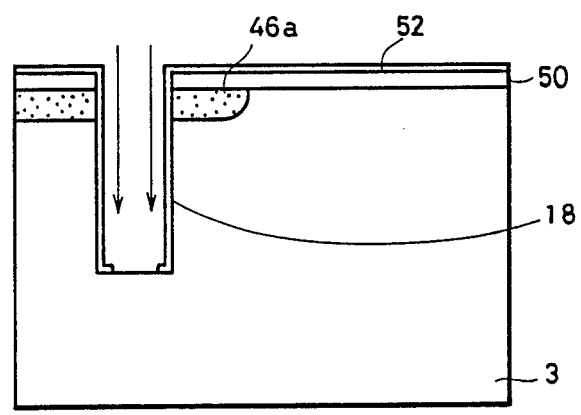
Figure 5C:
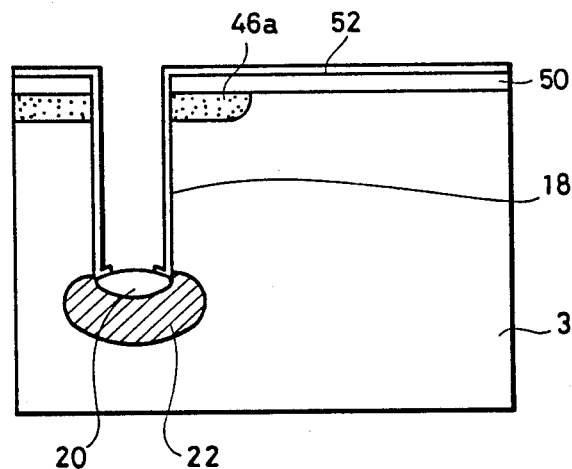
Figure 5D:
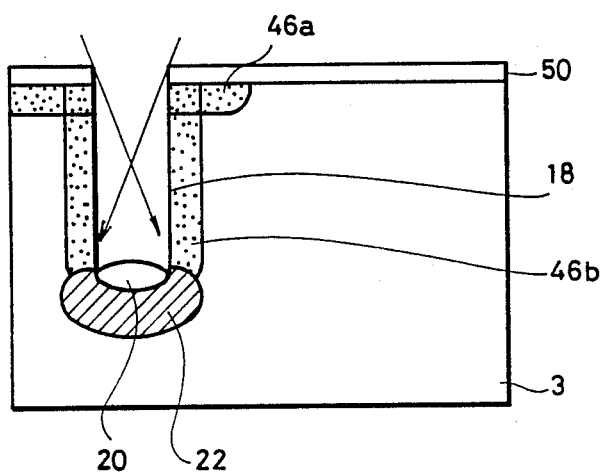
Figure 5E:
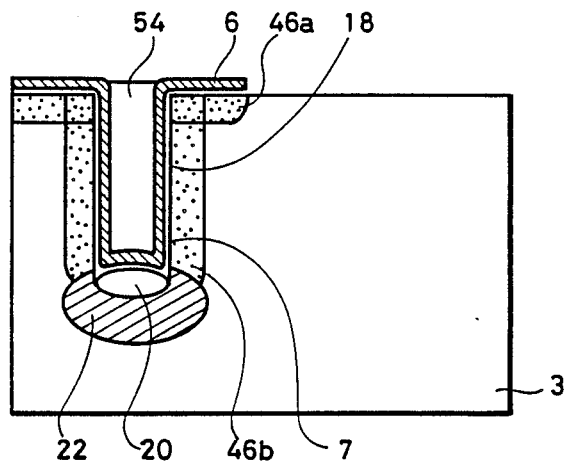
Figure 5F:
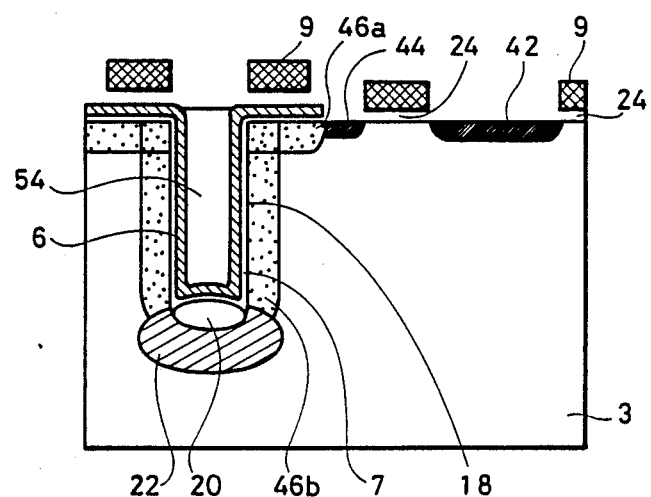
Figure 5G:
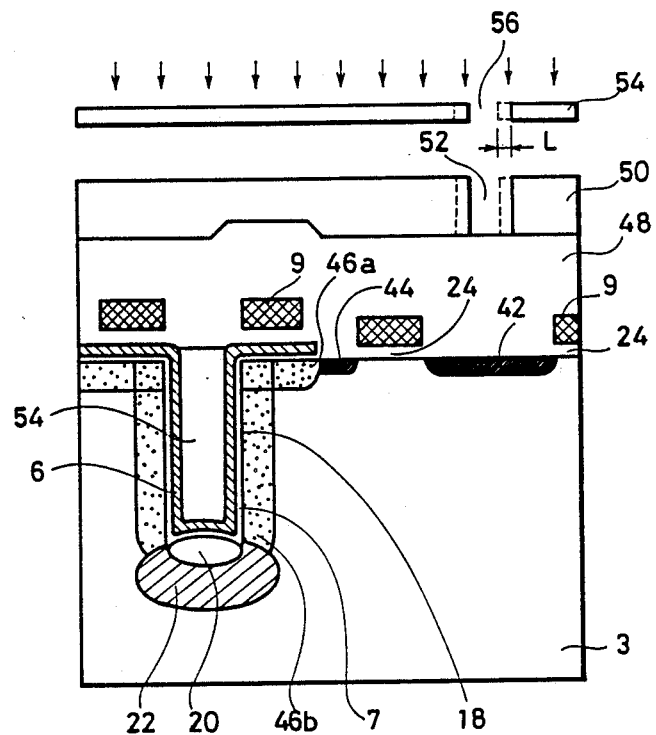
Figure 5H:
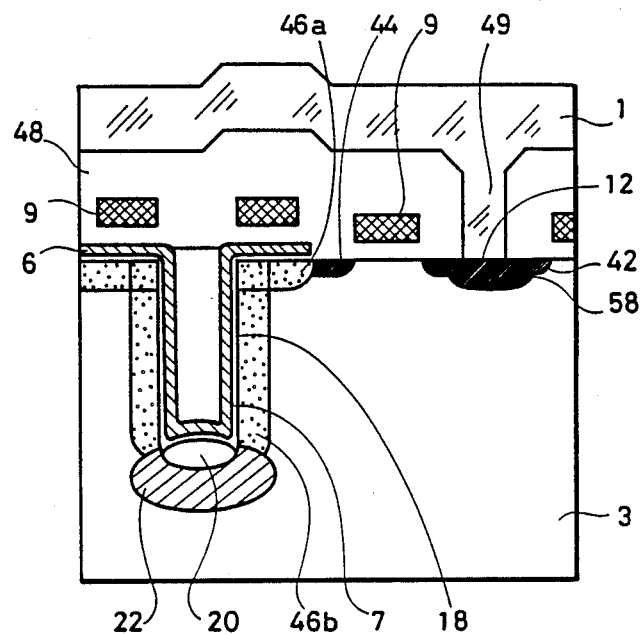
Figure 6:
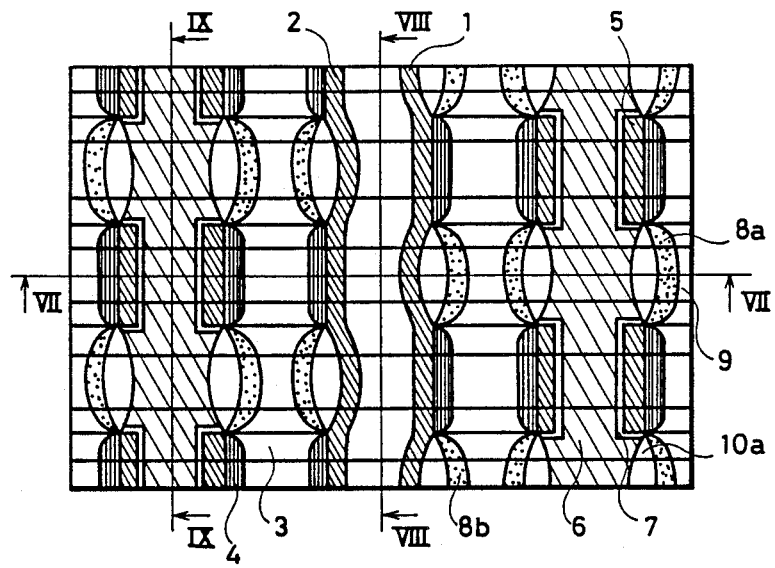
FIG. 6 illustrates plane layout of a first embodiment of the present invention.
Figure 7:
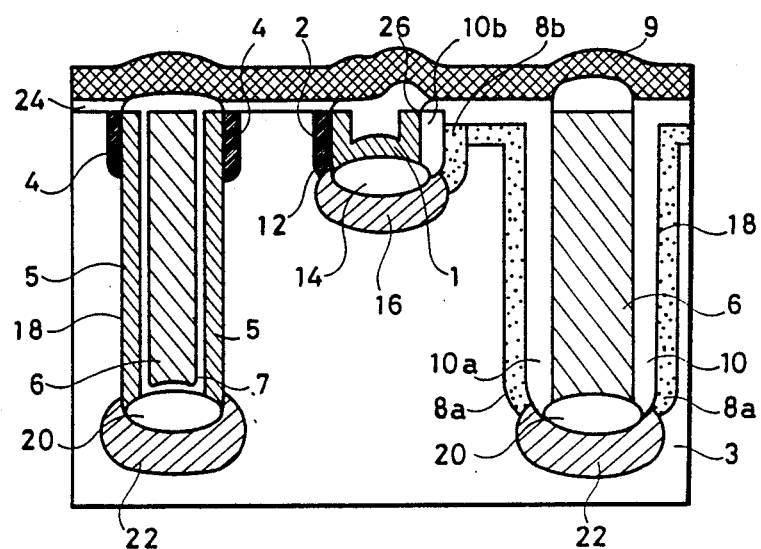
FIG. 7 is a sectional view taken along the line VII—VII in FIG. 6.
Figure 8:
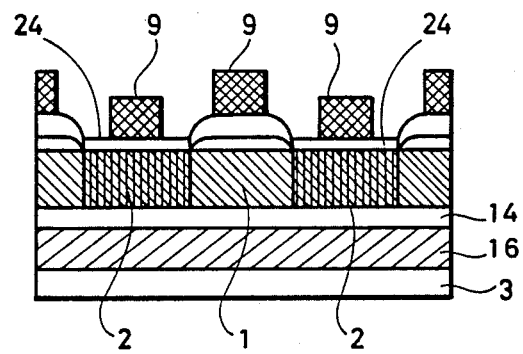
FIG. 8 is a sectional view taken along the line VIII—VIII in FIG. 6.
Figure 9:
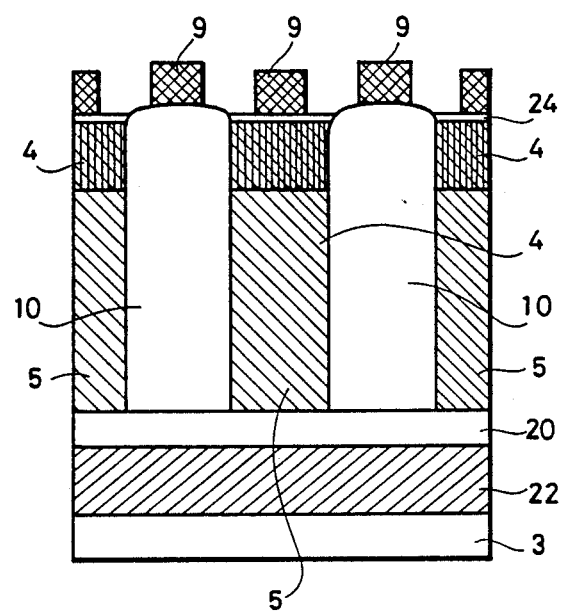
FIG. 9 is a sectional view taken along the line IX—IX in FIG. 6.

FIG. 6 illustrates plane layout of a first embodiment of the present invention and FIG. 7 is a sectional view taken along the line VII—VII in FIG. 6, while FIG. 8 is a sectional view taken along the line VIII—VIII in FIG. 6 and FIG. 9 is a sectional view taken along the line IX—IX in FIG. 6.

With reference to FIGS. 6 to 9, description is now made on the structure of this embodiment.

Trenches 26 and 18 are formed on the major surface of a semiconductor substrate 3 of silicon. While the trench 26 is formed vertically in series in FIG. 6, the trenches 18, which are provided around the same with different functional parts, are alternately repeated vertically in series. A bit line 1 of polysilicon or the like is formed in the interior of the trench 26, while isolation oxide films 14 and 10b are formed on a bottom portion and a side wall of the trench 26 respectively. Impurity layers 16 and 8b are formed on regions of the semiconductor substrate 3 being in contact with the isolation oxide films 14 and 10b to electrically isolate adjacent elements from each other with the isolation oxide films 14 and 10b. On the other hand, impurity layers 2 and 4 are formed partially on another side wall of the trench 26 and a side wall of the left trench 18 to serve as source or drain regions of a transistor. Polysilicon layers 5 are formed on both sides of the side wall of the left trench 18, to hold an inner part of the left trench 18, which is filled up with a cell plate 6 of polysilicon through a capacitor insulation film 7. Each polysilicon layer 5 forms a single capacitor with the capacitor insulation film 7 and the cell plate 6. An isolation oxide film 20 is formed on the bottom portion of the left trench 18 to isolate two capacitors formed in the left trench 18 from each other. An impurity layer 22 is further formed in a region under the isolation oxide film 20, to complete element isolation. The right trench 18 is adapted to isolate the left trenches- 18 being vertically adjacent in FIG. 6, i.e., vertically adjacent capacitors and transistor parts connected to the capacitors, from each other. A thick isolation oxide film 10 is formed in the interior of the right trench 18 to hold a cell plate 6, and an impurity layer 8a is further formed on the side wall of the right trench 18 formed with the isolation oxide film 10, thereby to complete element isolation by the isolation oxide film 10. Another isolation oxide film 20 is formed on a bottom portion of the right trench 18 and an impurity layer 22 is further formed in a region under the same to perform element isolation at the bottom portion of the right trench 18. The impurity layer 8a and an isolation oxide film 10a are connected to the impurity layer 8b on the flat part of the major surface of the semiconductor substrate 3 and the isolation oxide film 10b on the side wall of the trench 26 respectively. Thick oxide films are formed on the bit line 1 formed in the interior of the trench 26, the cell plate 6 formed in the interior of the left trench 18 and the cell plate 6 formed in the interior of the right trench 18 respectively, and a thin oxide layer 24 is formed on exposed major surface portions of the semiconductor substrate 3. A word line 9 of polysilicon is formed through patterning over these oxide films and above respective transistors and capacitors. A region of the semiconductor substrate 3, being held between the impurity layers 2 and 4, serves as a channel region so that the oxide film 24 on the channel region serves as a gate insulation film of a transistor, while a portion of the word line 9 above the same serves as a gate electrode.

Description is briefly made on the operation of a dynamic MOSRAM in the above structure.

When a prescribed potential is applied to the word line 9, being selected in writing operation, the impurity layers 2 and 4 conduct to invert the conductivity type of a region of the major surface of the semiconductor substrate 3 being held between the impurity layers 2 and 4. Thus, a potential applied to the bit line 1 passes through a transistor part formed by the impurity layer 2, the inverted region and the-impurity layer 4 through the contact 12 to be stored in the capacitor formed by the polysilicon layer 5, the capacitor insulation film 7 and the cell plate 6.

Also in reading operation, a prescribed potential is applied to the word line 9, being similarly selected, and the potential stored in the capacitor passes through the transistor part and the contact 12 to be applied to the bit line 1, so that this potential is detected.

Figure 10:
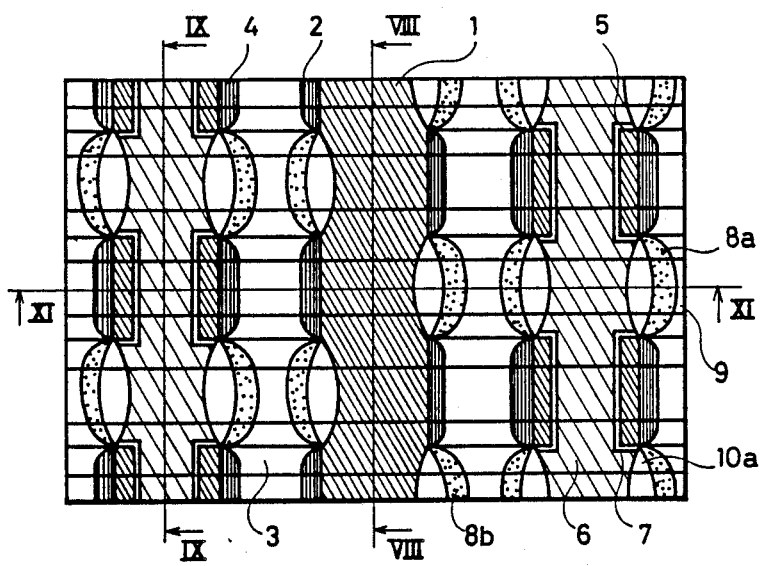
FIG. 10 illustrates plane layout of a second embodiment of the present invention.
Figure 11:
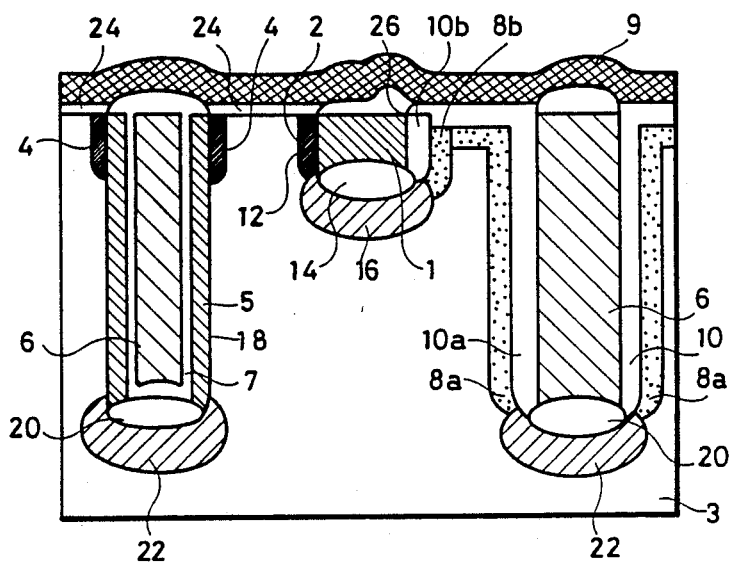
FIG. 11 is a sectional view taken along the line XI—XI in FIG. 10.

FIG. 10 illustrates plane layout of a second embodiment of the present invention, and FIG. 11 is a sectional view taken along the line XI—XI in FIG. 10.

With reference to FIGS. 10 and 11, description is now made on the structure of this embodiment.

The embodiment as shown in FIGS. 10 and 11 is similar in basic structure to that shown in FIGS. 6 and. 7, except for the sectional configuration of a conductor forming a bit line. 1.

According to this embodiment, such a conductor completely fills up a trench 26 to be increased in sectional area, whereby interconnection resistance of the bit line 1 can be effectively reduced in view of the operating characteristic. The trench 26 can be filled up with the conductor by properly adjusting the width of the trench 26 and formation thickness of the conductor.

Sectional views taken along the lines VIII—VIII and IX—IX in FIG. 10 are substantially identical to those shown in FIGS. 8 and 9.

FIGS. 12A to 12F are sectional views schematically showing steps of a method of manufacturing the first embodiment of the present invention.

The manufacturing method is now described with reference to FIGS. 12A to 12F.

Figure 12A:
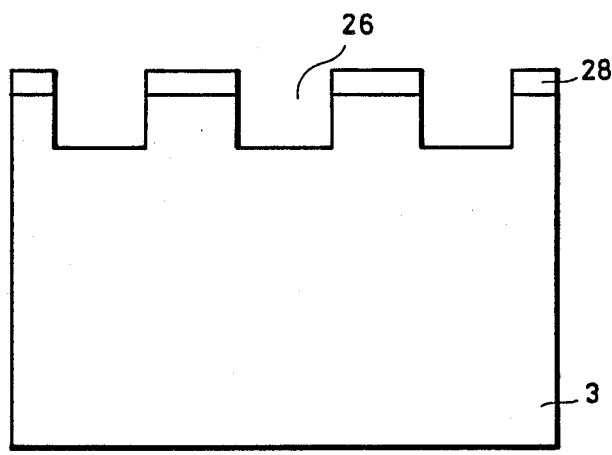
FIGS. 12A to 12F are sectional views schematically showing steps of a method of manufacturing the first embodiment of the present invention.

An oxide film 28 is formed over the entire surface of a semiconductor substrate 3 by thermal oxidation or the like. A resist film (not shown), being subjected to a photoengraving process, is utilized as a mask for selectively anisotropically etching the oxide film 28, and thereafter the resist film is removed. The selectively etched oxide film 28 is utilized as a mask to anisotropically etch the semiconductor substrate 3 by prescribed depth, thereby to form trenches 26 (FIG. 12A).

Figure 12B:
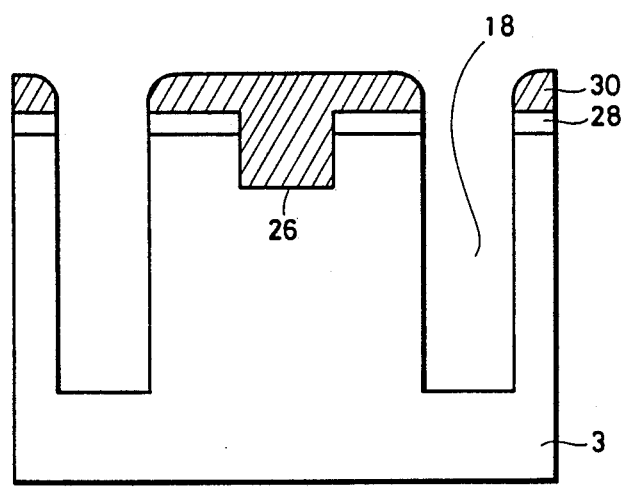

Then, a resist film 30 is formed to cover the entire major surface of the semiconductor substrate 3 including the inner surfaces of the trenches 26, thereby to partially expose the semiconductor substrate 3. The parts of the semiconductor substrate 3 exposed through the mask of the resist film 30 are anisotropically etched to form deeper trenches 18 (FIG. 12B).

Figure 12C:
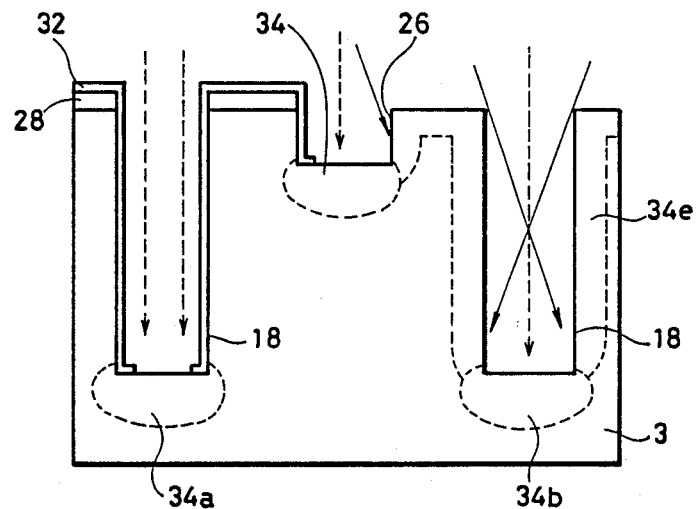

The resist film 30 is removed and a nitride film 32 is deposited over the entire surface of the semiconductor substrate 3. Then the nitride film 32 is removed from each bottom surface part of the trenches 18 and the trench 26 by an etchback process through anisotropic etching, and an ion being identical in conductivity type to the semiconductor substrate 3 is injected into the bottom surface parts of the- trenches 18 and 26 through ion implantation or the like. A photoengraving process is performed by a three-layer resist film to remove the nitride film 32 from positions other than a side wall of the trench 26 for serving as a contact part and the left trench 18 for serving as a capacitor part by anisotropic etching. The oxide film 28 thus exposed is removed and an ion being identical in conductivity type to the semiconductor substrate 3 is injected into the trench 18 and a side wall portion of the trench 26 other than the contact part and the capacitor part and a flat part by a process such as oblique ion implantation (FIG. 12C).

Figure 12D:
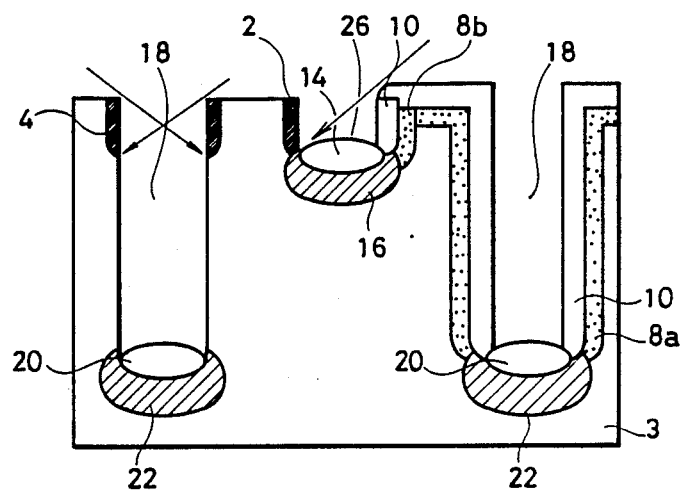

Interlayer isolation oxide films 20, 14 and 10 are formed on bottom surface portions of the trenches 18 and 26, a side wall portion of the right trench 18 and one side wall portion of the trench 26 respectively by thermal oxidation. At the same time impurity layers 8a, 16 and 22 of an ion which is identical in conductivity type to the semiconductor substrate 3 are formed on sides of the interlayer isolation oxide films 10, 14 and 20, which sides are closer to the semiconductor substrate 3, by thermal diffusion. Then the residual nitride film 32 is removed, and an ion being reverse in conductivity type to the semiconductor substrate 3 is obliquely implanted by a process such as oblique ion implantation and subjected to heat treatment, thereby to form impurity layers 2 and 4 of the ion which is reverse in conductivity type to the semiconductor substrate 3 on a side wall upper part of the left trench 18 and one side wall portion of the trench 26 (FIG. 12D).

Figure 12E:
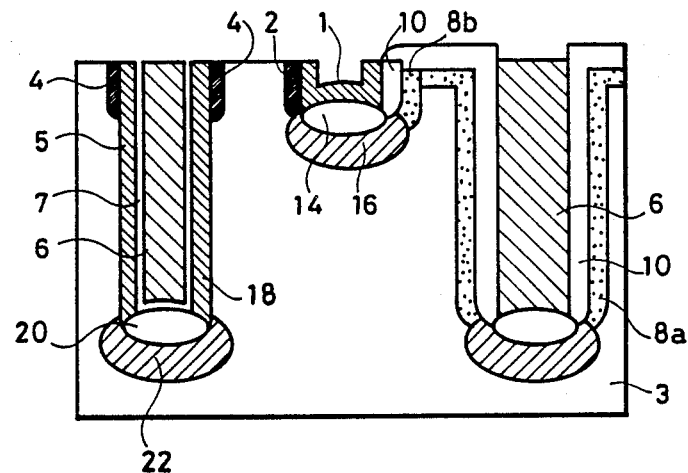

A polysilicon-system material is deposited over the entire surface of the semiconductor substrate 3 including the inner surfaces of trenches 18 and 26, to be coated with a resist material and flattened. Such resist and polysilicon-system materials are simultaneously etched by an etchback process performed through anisotropic etching, and the polysilicon-system material is removed from the flattened part thereby to form a polysilicon layer 1 for serving as a bit line and a polysilicon layer 5 for serving as one electrode of a capacitor simultaneously from the same polysilicon-system material. Upon completion of such an etchback process, a contact is formed in a self-alignment manner between the impurity layer 2 and the polysilicon layer 1 on the side wall portion of the trench 26. Further, a photoengraving process by a three-layer resist film and etching are performed to remove all of the polysilicon-system material on the interlayer isolation oxide film 10 on the side wall portion of the right trench 18, while hollowing the interior of the polysilicon layer 5 in the left trench 18. An oxide film 7 for serving as a capacitor gate insulation film is formed on the polysilicon layer 5 through a process such as thermal oxidation or CVD. A polysilicon-system material containing a conductive impurity is deposited over the entire surface including the inner surfaces of the trenches 18 to be coated with a resist material and flattened, and thereafter an etchback process is performed by anisotropic etching. Thus, the resist material and the polysilicon-system material containing the conductive impurity are simultaneously etched and the polysilicon system material on a flat portion is removed, thereby to form polysilicon layers 6, which are embedded in the trenches 18 to serve as cell plates for capacitors (FIG. 12E).

Figure 12F:
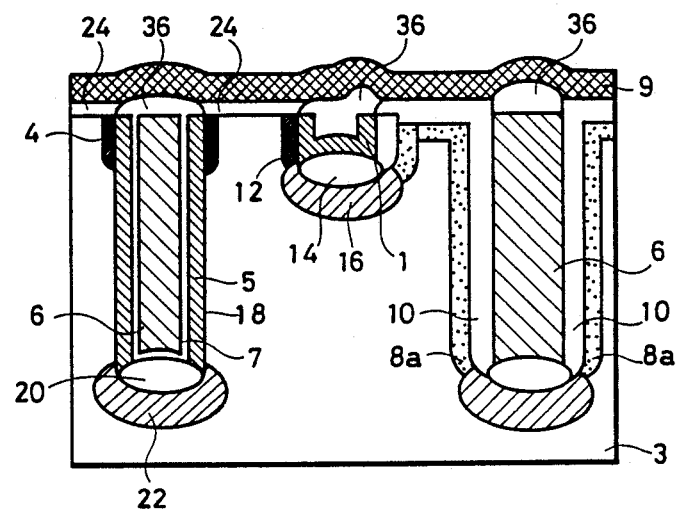

An oxide film 24 for serving as a transfer gate insulation film is formed o the major surface of the semiconductor substrate 3 held between the impurity layers 2 and 4 by thermal oxidation, while the polysilicon layers 1, 5 and 6 are also thermally oxidized at this time to form thick oxide films 36. Finally an interconnection layer material formed by a single layer of polysilicon, a double layer of metal silicide having a high melting point and polysilicon or a single layer of a metal having a high melting point is deposited to be subjected to a photoengraving process and etching for patterning, thereby to form a word line 9. Since the bit line 1 is embedded in the trench 26 and the word line 9 is formed on the same, no distance is required between the word line and a contact hole. Above all, the contact is not provided on the flat plane but on the side wall portion of the trench, whereby the contact area can be vertically saved to improve the degree and density of integration of the semiconductor device (FIG. 12F).

Figure 13:
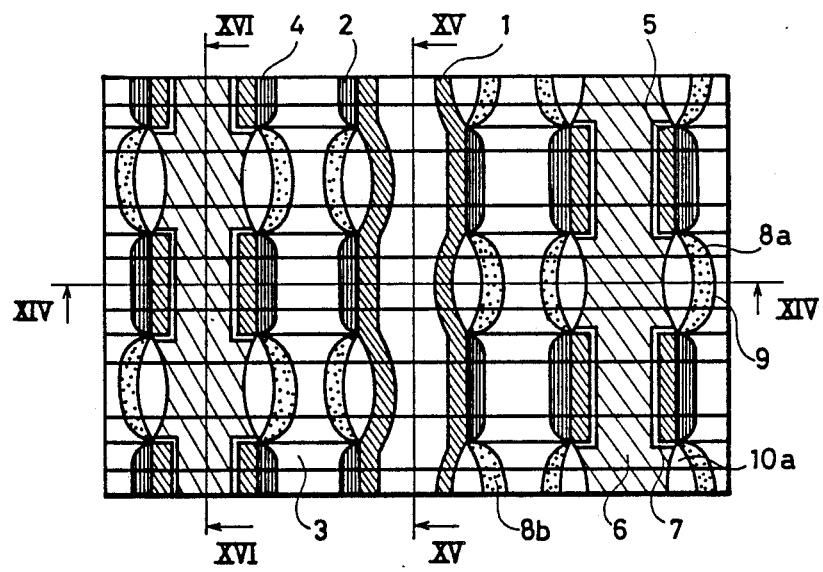
FIG. 13 illustrates plane layout of a third embodiment of the present invention.
Figure 14:
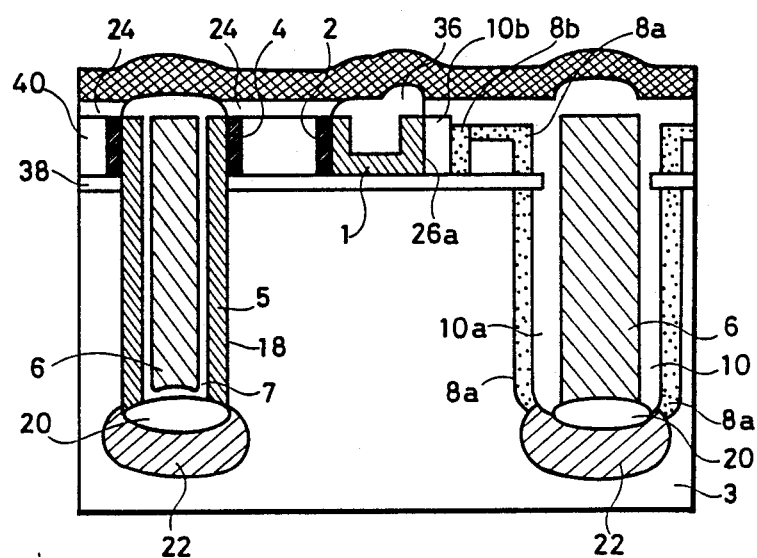
FIG. 14 is a sectional view taken along the line XIV—XIV in FIG. 13.
Figure 15:
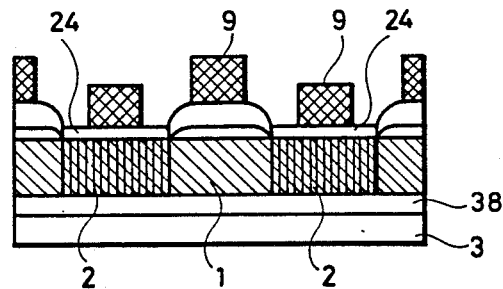
FIG. 15 is a sectional view taken along the line XV—XV in FIG. 13.
Figure 16:
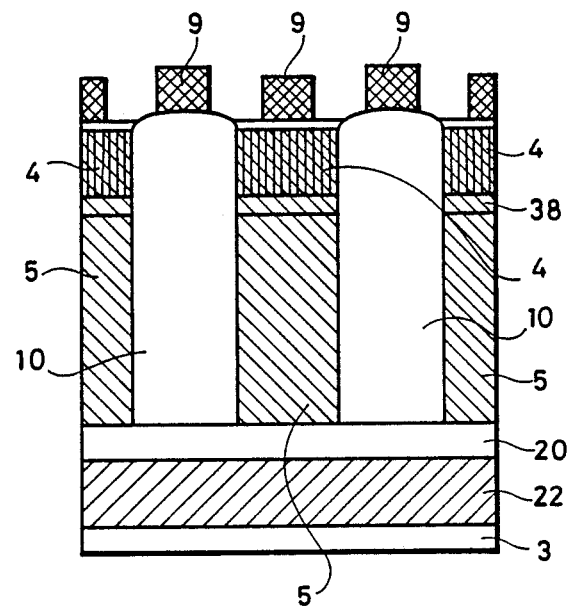
FIG. 16 is a sectional view taken along the line XVI—XVI in FIG. 13.

FIG. 13 illustrates plane layout of a third embodiment of the present invention and. FIG. 14 is a sectional view taken along the line XIV—XIV in FIG. 13, while FIG. 15 is a sectional view taken along the line XV—XV in FIG. 13 and FIG. 16 is a sectional view taken along the line XVI—XVI in FIG. 13.

With reference to FIGS. 13 to 16, description is now made on this structure.

This embodiment is basically similar in general structure to that shown in FIGS. 6 to 9, except for that no trench is directly provided on the major surface of a semiconductor substrate 3 but a semiconductor layer 40 is provided on the major surface through an oxide film 38, to form trenches 26a and 18 on the major surface of the semiconductor layer 40. Thus, there is no need to provide an interlayer isolation oxide film or an impurity layer on the bottom surface of the trench 26a, but the oxide film 38 is adapted to isolate adjacent elements.

Figure 17:
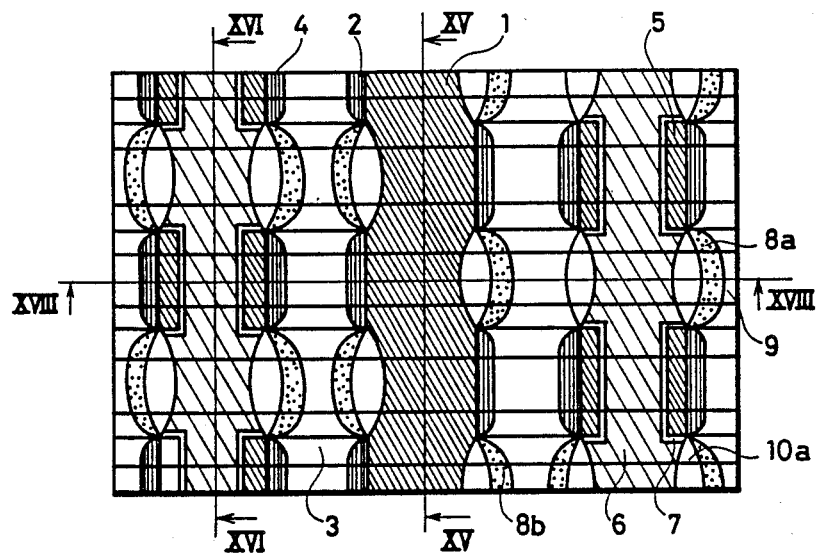
FIG. 17 illustrates plane layout of a fourth embodiment of the present invention.
Figure 18:
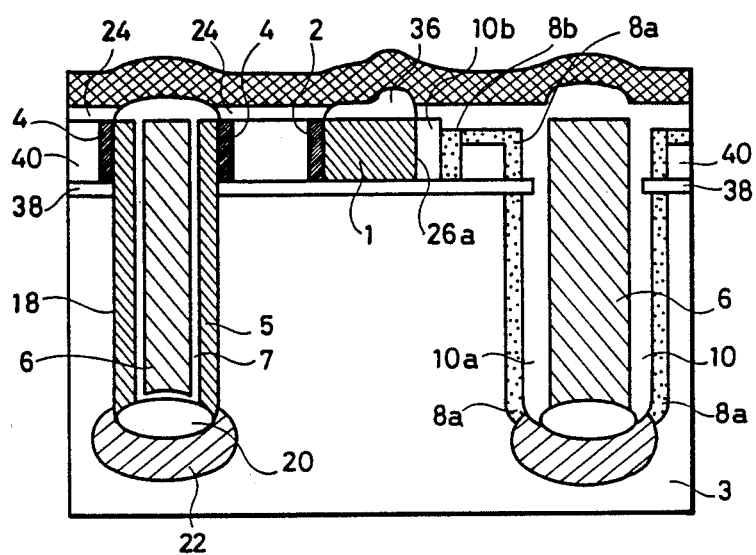
FIG. 18 is a sectional view taken along the line XVIII—XVIII in FIG. 17.

FIG. 17 illustrates plane layout of a fourth embodiment of the present invention, and FIG. 18 is a sectional view taken along the line XVIII—XVIII in FIG. 17.

With reference to FIGS. 17 and 18, description is now made on this structure.

This embodiment is similar in basic structure to that shown in FIGS. 13 and 14, except for the sectional configuration of a conductor forming a bit line 1.

According to this embodiment, such a conductor completely fills up a trench 26a to be increased in sectional area, whereby interconnection resistance of the bit line 1 can be reduced to effectively improve the operating characteristic. The trench 26a can be filled up with the conductor by properly adjusting the width of the trench 26a and formation thickness of the conductor.

Sectional views taken along the lines XV—XV and XVI—XVI in FIG. 17 are substantially identical to those shown in FIGS. 15 and 16.

A method of manufacturing the aforementioned third or fourth embodiment is basically similar to that shown in FIGS. 12A to 12F. In more concrete terms, an oxide film 38 is formed on the major surface of a semiconductor substrate 3 and a semiconductor layer 40 is formed on the oxide film 38 in advance of the step as shown in FIG. 12A, and then an oxide film 28 is formed on the semiconductor layer 40. Then trenches 26 are formed to reach the oxide film 38, and thereafter the steps as shown in FIGS. 12B to 12F are performed. Since no isolation oxide film or impurity layer is required on the bottom surface of the trench 26a, the trench 26a may be appropriately employed as a mask by resist or the like.

Although the bit line is prepared by a polysilicon-system material in each of the aforementioned embodiments of the inventions, the same may be prepared by a conductor of another material such as a double layer of metal silicide having a high melting point and polysilicon, or metal having a high melting point, as a matter of course.

Figure 19:
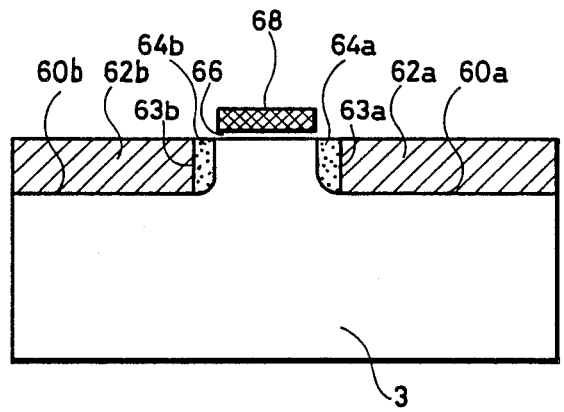
FIG. 19 is a sectional view schematically showing a fifth embodiment of the present invention.

FIG. 19 is a sectional view schematically showing a fifth embodiment of the present invention.

Referring to FIG. 19, a semiconductor substrate 3 of silicon is provided on its major surface with trenches 60a and 60b which horizontally extend along the plane of this figure, while impurity regions 64a and 64b are formed on side walls 63a and 63b of the trenches 60a and 60b respectively. The impurity regions 64a and 64b serve as source/drain regions of a transistor, while a gate electrode 68 is formed through an insulation film 66 on a region of the semiconductor substrate 3 for serving as a channel region between the source/drain region. Conductors 62a and 62b such as polysilicon, for example, fill up the trenches 60a and 60b, to serve as interconnection members connected with the source/drain regions.

According to the above structure, the side walls 63a and 63b serve as contact regions between the interconnection members and the source/drain regions, whereby no contact hole is required similarly to the aforementioned embodiments. Considering either the conductor 62a or 62b as a bit line and the gate electrode 68 as a word line, the bit line and the word line are securely isolated from each other since there is no contact hole, while the isolation distance is increased.

Figure 20:
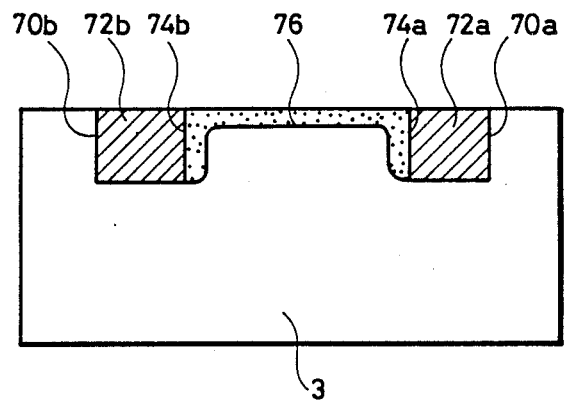
FIG. 20 is a sectional view schematically showing a sixth embodiment of the present invention.

FIG. 20 is a sectional view schematically showing a sixth embodiment of the present invention.

This structure is now described with reference to FIG. 20.

Two trenches 70a and 70b are formed on the major surface of a semiconductor substrate 3 of silicon, while an impurity layer 76 is formed along side walls of the trenches 70a and 70b and on the major surface of the semiconductor substrate 3 in a region held between the two trenches 70a and 70b. Conductive materials such as polysilicon fill up the trenches 70a and 70b to provide interconnection layers 72a and 72b, which are in contact with the impurity layer 76 through contacts 74a and 74b formed on the side walls of the trenches 70a and 70b. Thus, the interconnection layers 72a and 72b are in conduction through the impurity layer 76 while being embedded in the semiconductor substrate 3, which is provided thereon with no projection, whereby an insulation film such as an oxide film can be formed on the same to be overlapped with still another component particularly advantageously in a semiconductor device to be improved in degree of integration. Namely, this embodiment is applicable not only to a memory cell part of a semiconductor memory device but also to a peripheral circuit or a logic circuit, with no apprehension for disconnection of the interconnection layers or contact failure.

Although the side wall of the trench serving as a contact part is perpendicular to the major surface of the semiconductor substrate in each of the aforementioned embodiments, the same may not necessarily be perpendicular but may be at an obtuse angle or an acute angle with respect to the major surface, to attain a similar effect.

According to the present invention as hereinabove described with reference to the preferred embodiments, elements of an integrated circuit can be joined with each other with no planar occupied area, thereby to improve the degree of integration of a semiconductor memory device.

According to the present invention, further, a bit line and a transistor of a semiconductor memory device can be connected with each other with no contact hole, while the bit line can be securely isolated from a word line.

According to the present invention, in addition, a transistor and a conductor in a semiconductor device can be reliably connected with each other with no formation of a contact hole.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a transistor and a capacitor connected to said transistor, and a first conductor interconnecting said transistor with an external circuit, said semiconductor memory device comprising:

a semiconductor substrate having a major surface and a first trench formed on said major surface, said first trench having a side wall;

a first impurity region formed on said side wall of said first trench to be connected to said transistor; and said first conductor formed in said first trench in contact with said first impurity region.

2. A semiconductor memory device in accordance with claim 1, wherein said transistor has a source region and a drain region which are formed on said major surface of said semiconductor substrate, said first impurity region being connected to said source or drain region.

3. A semiconductor memory device in accordance with claim 2, wherein a second trench having a side wall is further formed on said major surface of said semiconductor substrate, said capacitor being formed in said second trench.

4. A semiconductor memory device in accordance with claim 3, wherein said capacitor is formed by a second conductor provided on said side wall of said second trench, a first insulation film provided on said second conductor and a third conductor provided on said first insulation film.

5. A semiconductor memory device in accordance with claim 4, wherein a second impurity region is formed on a part of said side wall of said second trench which is provided thereon with said second conductor, said second impurity region being connected to said source or drain region forming said transistor.

6. A semiconductor memory device in accordance with claim 5, wherein said transistor has a channel region which is a region of said major surface of said semiconductor substrate held between said source and drain regions.

7. A semiconductor memory device in accordance with claim 6, wherein a second insulation film is further formed on said major surface of said semiconductor substrate including said first and second trenches, a fourth conductor being formed on said second insulation film.

8. A semiconductor memory device in accordance with claim 7, wherein said transistor has a gate electrode and a gate insulation film, said gate electrode being a part of said fourth conductor provided above said channel region, said gate insulation film being a part of said second insulation film provided on said channel region.

9. A semiconductor memory device in accordance with any one of claims 1 to 8, wherein said first trench is filled up with said first conductor.

10. A semiconductor memory device in accordance with claim 1, wherein said first trench has a bottom portion, third insulators being further formed on said bottom portion and a side wall of said first trench being opposite to said side wall formed with said first impurity region.

11. A semiconductor memory device in accordance with claim 10, wherein a third impurity region is further formed on a region of said semiconductor substrate under said third insulator formed on said bottom portion of said first trench.

12. A semiconductor memory device in accordance with claim 10, wherein
a fourth impurity region is further formed on a region of said semiconductor substrate being in contact with said third insulator formed on said side wall of said first trench.

13. A semiconductor memory device in accordance with claim 1, wherein
said first conductor is a bit line.

14. A semiconductor memory device in accordance with claim 7, wherein
said fourth conductor is a word line.

15. A semiconductor memory device in accordance with claim 14, wherein
said fourth conductor is formed on said first trench in a direction along said second trench.

16. A semiconductor memory device including a transistor and a capacitor connected to said transistor, said device formed on a common semiconductor substrate and comprising:
a bit line and a word line orthogonal to each other and intersecting at a cell of said memory device, said cell including
(a) a first trench formed in a major surface of said substrate and having a side wall;
(b) a first impurity region formed on said side wall of said first trench and connected to said transistor;
(c) said bit line formed in said first trench in contact with said first impurity region;
and a signal flow path established through said substrate interconnecting said transistor and said capacitor of said cell. —

17. A semiconductor memory device including a transistor and a capacitor connected to said transistor, said semiconductor memory device comprising:
a semiconductor substrate having a major surface;
a first insulation film formed on said major surface of said semiconductor substrate;
a semiconductor layer formed on said first insulation film and having a major surface and a first trench formed on said major surface to reach said first insulation film, said first trench having a side wall;
a first impurity region formed on said side wall of said first trench to be connected to said transistor; and
a first conductor formed in said first trench to be in contact with said first impurity region.

18. A semiconductor memory device in accordance with claim 17, wherein
said transistor has a source region and a drain region which are formed on said major surface of said semiconductor layer,
said first impurity region being connected to said source or drain region.

19. A semiconductor memory device in accordance with claim 18, wherein
said semiconductor layer is further formed on said major surface with a second trench reaching the interior of said semiconductor substrate and having a side wall,
said capacitor being formed in said second trench.

20. A semiconductor memory device in accordance with claim 19, wherein
said capacitor is formed by a second conductor provided on said side wall of said second trench, a second insulation film provided on said second conductor and a third conductor provided on said second insulator.

21. A semiconductor memory device in accordance with claim 20, wherein
a second impurity region is formed on a region of said second semiconductor layer, being a part of said side wall which is formed thereon with said second conductor of said second trench, said second impurity region being connected to said source or drain region forming said transistor.

22. A semiconductor memory device in accordance with claim 21, wherein
said transistor has a channel region which is a region on said major surface of said semiconductor layer held between said source and drain regions.

23. A semiconductor memory device in accordance with claim 22, wherein
a third insulation film is further formed on said major surface of said semiconductor layer including said first and second trenches,
a fourth conductor being formed on said third insulation film.

24. A semiconductor memory device in accordance with claim 23, wherein
said transistor has a gate electrode and a gate insulation film,
said gate electrode being a part of said fourth conductor provided above said channel region,
said gate insulation film being a part of said third insulation film provided on said channel region.

25. A semiconductor memory device in accordance with claim 17, wherein
said first trench is filled up with said first conductor.

26. A semiconductor memory device in accordance with claim 17, wherein
a fourth insulation film is further formed on a side wall of said first trench being opposite to said side wall formed with said first impurity region.

27. A semiconductor memory device in accordance with claim 26, wherein
a third impurity region is further formed on a region of said semiconductor layer being in contact with said fourth insulation film formed on said side wall of said first trench.

28. A semiconductor memory device in accordance with claim 17, wherein
said first conductor is a bit line.

29. A semiconductor memory device in accordance with claim 23, wherein
said fourth conductor is a word line.

30. A semiconductor device comprising:
a semiconductor substrate having a major surface and a first trench formed on said major surface, said first trench having a side wall;
a first impurity region formed on a part of said major surface of said semiconductor substrate including said side wall of said first trench;
a first conductor formed in said first trench and in contact with said impurity region;
a second trench having a side wall formed on said major surface of said semiconductor substrate;
a second impurity region formed on said side wall of said second trench and connected to said first impurity region; and
a second conductor formed in said second trench and in contact with said second impurity region.

31. A semiconductor device in accordance with claim 30, wherein said first and second conductors fill up said first and second trenchers.

32. A semiconductor device in accordance with claim 31, wherein said first and second conductors are interconnection layers.

33. A semiconductor device in accordance with claim 31, wherein said semiconductor device comprises a semiconductor memory device having a capacitor.

* * * * *